United States Patent
Oi et al.

(10) Patent No.: US 7,319,049 B2
(45) Date of Patent: Jan. 15, 2008

(54) METHOD OF MANUFACTURING AN ELECTRONIC PARTS PACKAGING STRUCTURE

(75) Inventors: Kiyoshi Oi, Nagano (JP); Yasuyoshi Horikawa, Nagano (JP); Akihito Takano, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 358 days.

(21) Appl. No.: 11/114,168

(22) Filed: Apr. 26, 2005

(65) Prior Publication Data
US 2005/0247665 A1  Nov. 10, 2005

(30) Foreign Application Priority Data
May 10, 2004  (JP)  ............... 2004-139543

(51) Int. Cl.
| | |
|---|---|
| H01L 21/50 | (2006.01) |
| H01L 21/48 | (2006.01) |
| H01L 21/44 | (2006.01) |
| H01L 23/53 | (2006.01) |
| H01L 23/12 | (2006.01) |
| H01L 23/52 | (2006.01) |
| H01L 23/48 | (2006.01) |

(52) U.S. Cl. ............... 438/106; 257/700; 257/723; 257/773; 257/686; 257/774; 257/777; 257/E21.511

(58) Field of Classification Search ............... 438/106; 257/686, 701, 723, 773–744, 777, 700, E21.511
See application file for complete search history.

(56) References Cited

U.S. PATENT DOCUMENTS

| | | | |
|---|---|---|---|
| 6,590,291 B2 * | 7/2003 | Akagawa ............... | 257/774 |
| 6,734,542 B2 | 5/2004 | Nakatani et al. | |
| 6,784,530 B2 * | 8/2004 | Sugaya et al. ............ | 257/686 |
| 6,841,413 B2 * | 1/2005 | Liu et al. ............... | 438/106 |
| 6,858,892 B2 * | 2/2005 | Yamagata ............... | 257/300 |
| 2002/0175402 A1 * | 11/2002 | McCormack et al. ........ | 257/700 |

FOREIGN PATENT DOCUMENTS

JP  2002-261449  9/2002

* cited by examiner

*Primary Examiner*—Luan Thai
(74) *Attorney, Agent, or Firm*—Kratz, Quintos & Hanson, LLP

(57) ABSTRACT

A method of manufacturing an electronic parts packaging structure of the present invention, includes the steps of forming a first uncured resin layer on a substrate, arranging an electronic parts on the first uncured resin layer, forming a second uncured resin layer that covers the electronic parts, and obtaining an insulating layer, in which the electronic parts is embedded, by curing the first uncured resin layer and the second uncured resin layer by annealing.

19 Claims, 13 Drawing Sheets

METHOD OF MANUFACTURING AN ELECTRONIC PARTS PACKAGING STRUCTURE

CROSS-REFERENCE TO RELATED APPLICATIONS

This application is based on and claims priority of Japanese Patent Application No. 2004-139543 filed on May 10, 2004, the entire contents of which are incorporated herein by reference.

BACKGROUND OF THE INVENTION

1. Field of the Invention

The present invention relates to a method of manufacturing an electronic parts packaging structure and, more particularly, a method of manufacturing an electronic parts packaging structure having such a structure that an electronic parts is embedded in an insulating layer.

2. Description of the Related Art

In the prior art, there is the electronic parts packaging structure having such a structure that the electronic parts is embedded in the insulating layer. As an example of the method of manufacturing such electronic parts packaging structure, as shown in a lower view of FIG. 1A, first bumps 202 of an electronic parts 200 are flip-chip bonded onto a lower copper foil 100, and then an underfill resin 102 is filled in a clearance between the electronic parts 200 and the lower copper foil 100.

Then, as shown in middle and upper views of FIG. 1A, an uncured resin film 106, in which conductive posts 104 are provided, and an upper copper foil 110 are arranged over the electronic parts 200, and then these elements are pushed against the electronic parts 200 side. Consequently, as shown in FIG. 1B, the electronic parts 200 is embedded in a resin film 106a and also the upper copper foil 110 is adhered onto the resin film 106a. At this time, the conductive post 104 is connected electrically to the lower copper foil 100 and the upper copper foil 110 respectively.

Then, the interlayer insulating layer 106, in which the electronic parts 200 is embedded, is obtained by curing the uncured resin film 106a by means of the annealing. Then, as shown in FIG. 1C, wiring patterns 108 that are connected mutually via the conductive post 104 are formed on both surface sides of the interlayer insulating layer 106 respectively by patterning the upper copper foil 110 and the lower copper foil 100. Then, a predetermined built-up wiring connected to the wiring patterns 108 is stacked, as the case may be.

The method similar to such manufacturing method is set forth in Patent Literature 1 (Patent Application Publication (KOKAI) 2002-261449), for example.

However, the underfill resin 102 formed of the different material from the interlayer insulating layer 106 is present under the electronic parts 200. Thus, when the reliability test using the thermal cycle is executed, the thermal stress is generated due to the difference of coefficients of the thermal expansion between these elements. Therefore, there exists the problem that either the crack is caused in the interlayer insulating layer 106 or the contact failure is generated between the electronic parts 200 and the wiring patterns 108. Also, when the electronic parts is face-up mounted, the back side of the electronic parts must be bonded onto the substrate via the die attaching material the material of which is different from the interlayer insulating layer. As a result, the similar problem is ready to occur.

In addition, the method of embedding the electronic parts in the resin film by pushing the electronic parts against the uncured resin film may be employed. According to this method, the uncured resin film 106a can have flexibility to some extent, nevertheless in some cases the fault such as the crack, or the like may be caused in the electronic parts whose mechanical strength is weak because the electronic parts must be pushed by applying a relatively high pressure.

SUMMARY OF THE INVENTION

It is an object of the present invention to provide a method of manufacturing an electronic parts packaging structure having such a structure that an electronic parts is embedded in an insulating layer, capable of preventing generation of various failures in the reliability test by using a thermal cycle and also lessening the damage of the electronic parts.

The present invention is concerned with a method of manufacturing an electronic parts packaging structure, which comprises the steps of forming a first uncured resin layer on a substrate; arranging an electronic parts on the first uncured resin layer; forming a second uncured resin layer that covers the electronic parts; and obtaining an insulating layer, in which the electronic parts is embedded, by curing the first uncured resin layer and the second uncured resin layer by annealing.

In the preferred embodiment of the present invention, first the first uncured resin layer is temporarily adhered onto the substrate, and then the electronic parts is arranged on the first uncured resin layer in a state that the first uncured resin layer is being heated. At this time, the electronic parts is pushed to such an extent that the electronic parts is not damaged and thus the electronic parts is temporarily adhered onto the first uncured resin layer.

Then, the uncured resin film is arranged on the electronic parts and then is pushed to the electronic parts side while heating in the vacuum atmosphere. Thus, the second uncured resin layer for covering the electronic parts is formed. At this time, since the second uncured resin layer covers the electronic parts in its fluidized state by the heating, it is possible to avoid such a situation that the electronic parts is damaged.

Then, the first and second uncured resin layers are cured by the annealing, so that the insulating film in which the packaging structure is embedded is obtained. As a result, the electronic parts is adhered onto the substrate by the insulating layer.

In addition, since the same insulating material can be chosen as the first and second uncured resin layers, the electronic parts can be embedded in the first interlayer insulating layer made of the same material. Therefore, the thermal stress generated due to the difference of the coefficients of thermal expansion can be suppressed in applying the reliability test to the electronic parts packaging structure by using the thermal cycle. As a result, such faults can be overcome that the crack is caused in the interlayer insulating layer, the defective contact is generated between the electronic parts and the wiring patterns, and the like, and thus the reliability of the electronic parts packaging structure can be improved. In other words, upon actually employing the electronic parts packaging structure in the first embodiment, generation of the crack and the contact failure due to the thermal stress can be prevented.

Also, in the preferred embodiment of the present invention, the substrate is a first temporal substrate, and the method of manufacturing an electronic parts packaging structure further comprises the step of forming a structure in which a conductive post that passes through the first uncured resin layer and the second uncured resin layer is provided and a second temporal substrate is arranged on the second uncured resin layer, after the step of forming the second uncured resin layer but before the step of obtaining the insulating layer; and further comprises the step of removing selectively the first temporal substrate and the second temporal substrate, after the step of obtaining the insulating layer.

In this mode, first the first uncured resin layer is temporarily adhered onto the first temporal substrate such as the removable metal substrate, like the above invention, then the electronic parts is arranged thereon, and then the second uncured resin layer for covering the electronic parts is formed.

Then, the conductive posts that pass through the first and second uncured resin layers are formed, and then the second temporal substrate is arranged on the second uncured resin layer. Otherwise, the conductive posts provided upright on the second temporal substrate may be thrust into the first and second uncured resin layers.

Then, the insulating layer in which the electronic parts is embedded is obtained by curing the first and second uncured resin layers by means of the annealing, and then the first and second temporal substrates are removed selectively.

In this embodiment, like the above invention, since the electronic parts can be embedded in the insulating layer made of the same material, the reliability of the electronic parts packaging structure can be improved. In addition, the temporal substrate is removed finally, and thus the insulating film in which the electronic parts is embedded is used as the core substrate. As a result, a reduction in thickness of the electronic parts packaging structure can be attained.

As described above, according to the present invention, the electronic parts can be embedded in the insulating layer made of the same material not to sustain the damage. Therefore, the reliability of the electronic parts packaging structure can be improved.

DETAILED DESCRIPTION OF THE PREFERRED EMBODIMENTS

Embodiments of the present invention will be explained with reference to the accompanying drawings hereinafter.

First Embodiment

FIGS. 2A to 2J are sectional views showing a method of manufacturing an electronic parts packaging structure according to a first embodiment of the present invention.

Figure 1A:
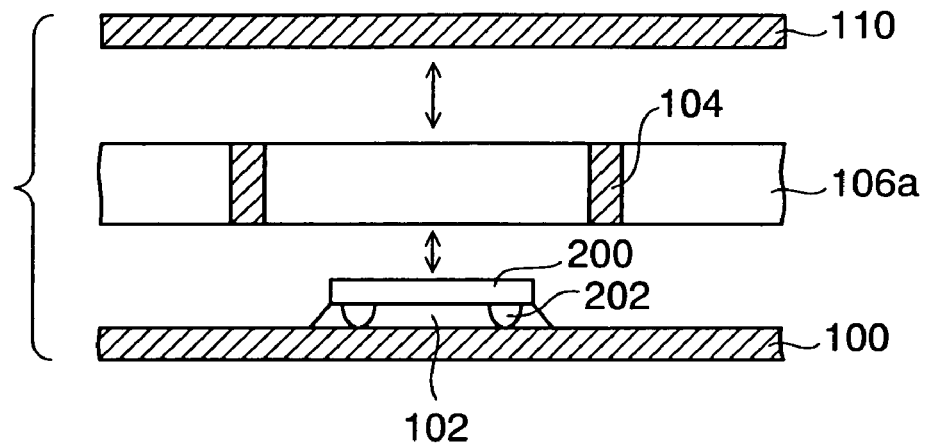
FIGS. 1A to 1C are sectional views showing a method of manufacturing an electronic parts packaging structure in the prior art.
Figure 1B:
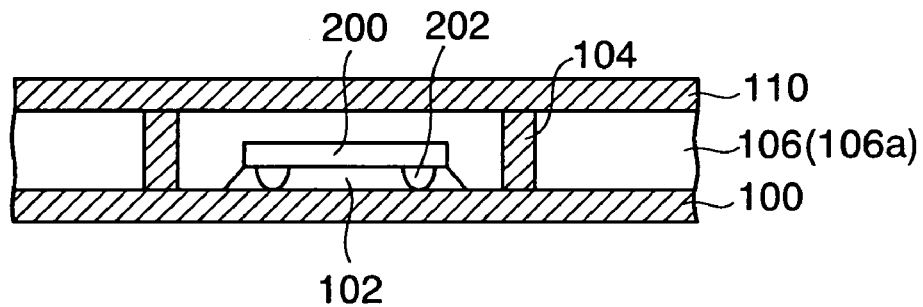
Figure 1C:
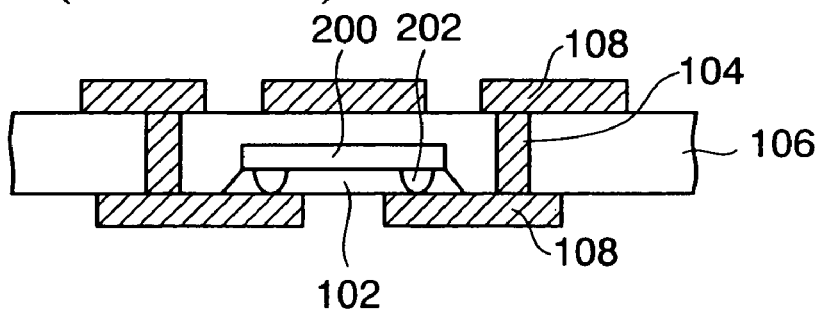
Figure 2A:
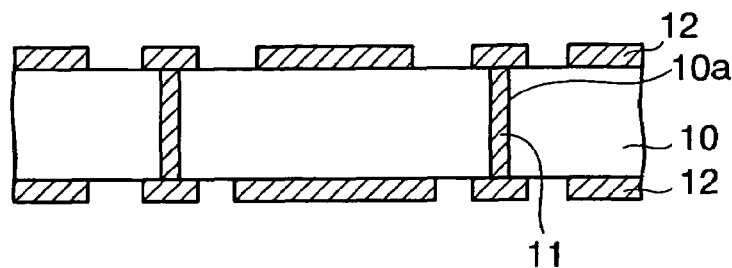
FIGS. 2A to 2J are sectional views showing a method of manufacturing an electronic parts packaging structure according to a first embodiment of the present invention.

In the method of manufacturing the electronic parts packaging structure in the first embodiment, as shown in FIG. 2A, first a core substrate 10 on both surfaces of which a first wiring pattern 12 is provided respectively is prepared. The core substrate 10 is made of an insulator such as a glass epoxy resin, or the like. Through holes 10a are provided in the core substrate 10 to pass therethrough. A conductive post 11 is provided in the through hole 10a, and the first wiring patterns 12 on both surface sides of the core substrate 10 are connected mutually via the conductive posts 11.

Figure 2B:
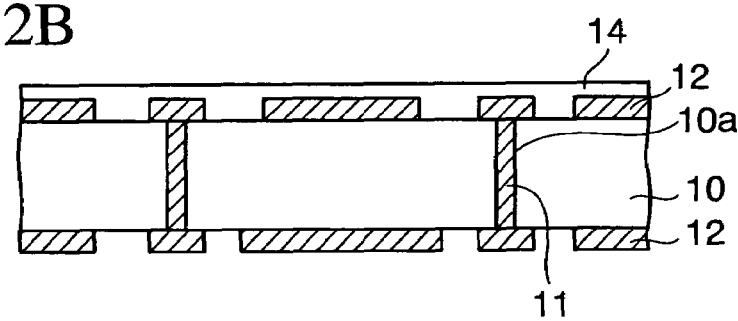

Then, as shown in FIG. 2B, an uncured (B-stage (semi-cured condition)) resin film is pasted onto the upper surface side of the core substrate 10 in the vacuum atmosphere. Thus, a first uncured resin layer 14 having a film thickness of 10 to 100 µm, for example, is formed. As an example of the conditions applied to form the first uncured resin layer 14, a pressure in the vacuum atmosphere: 133 Pa, a temperature: 120° C., a pushing force: 1 MPa, and a process time: 15 sec may be employed. Thus, the first uncured resin layer 14 is adhered temporarily onto the core substrate 10. As the material of the first uncured resin layer 14, an epoxy resin, a polyimide resin, a polyphenylene ether resin, or the like may be employed.

Figure 2C:
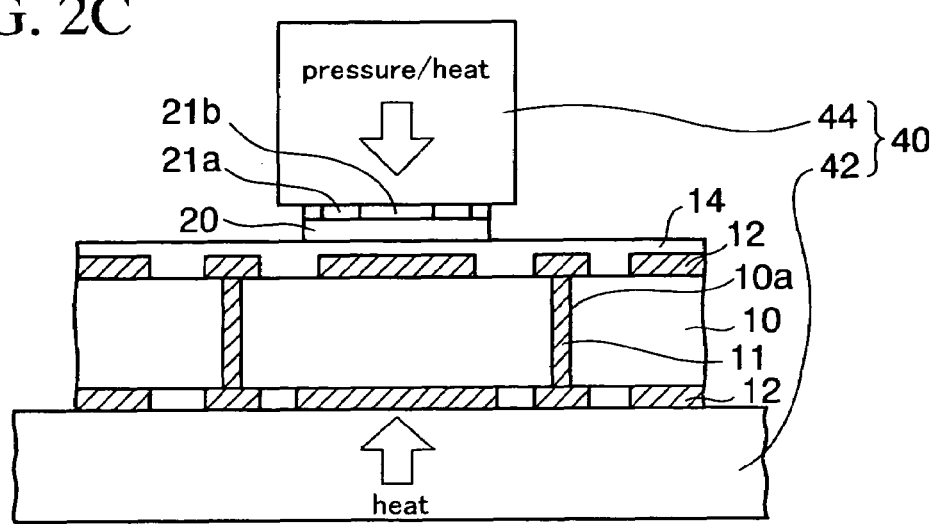

Then, as shown in FIG. 2C, an electronic parts 20 and an electronic parts mounting device 40 are prepared. In the present embodiment, a semiconductor chip is listed as the electronic parts 20. Connection pads 21a are provided on a surface of the electronic parts 20, and remaining areas of the electronic parts 20 are covered with a passivating film 21b. As the electronic parts 20, the passive components such as the capacitor parts, and the like may be employed in addition to the semiconductor chip, and its thickness is set to 100 µm or less (preferably 50 µm).

Also, the electronic parts mounting device 40 has a stage 42 on which the mounted body is mounted, and a transfer head 44 used to transfer the electronic parts. The stage 42 has a heating function and is able to heat the mounted body. The transfer head 44 can pick up the electronic parts by the vacuum contact and move in the x-y-z (horizontal/vertical) directions, and thus can place the electronic parts in a state that the electronic parts is aligned with a predetermined position. In addition, the transfer head 44 has a heating function and a function of applying a pressure to the electronic parts downward. As the electronic parts mounting device 40, a bonding tool such as a flip-chip bonder, a mounter, or the like can be used.

Then, as shown similarly in FIG. 2C, the core substrate 10 on which the first uncured resin layer 14 is formed is placed on the stage 42. Then, the electronic parts 20 is picked up by the transfer head 44 such that the connection pads 21a of the electronic parts 20 are directed upward (face-up), and then the electronic parts 20 is arranged on the first uncured resin layer 14 in a state that the electronic parts is aligned with a predetermined portion.

Figure 2D:
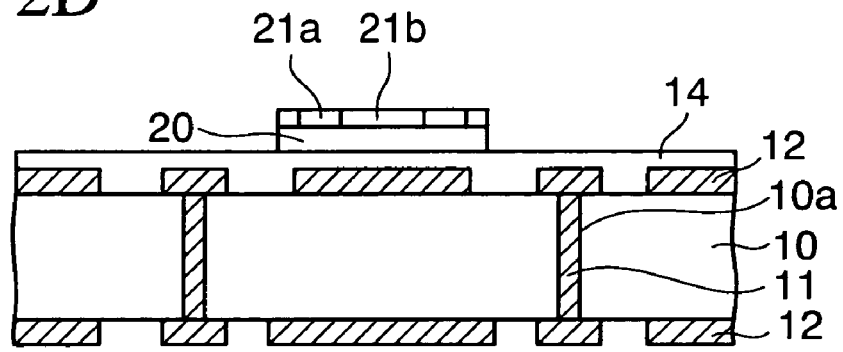

At this time, the first uncured resin layer 14 is heated by the stage 42 and the transfer head 44 and at the same time the electronic parts 20 is pressed toward the first uncured resin layer 14 side with a low pressure by the transfer head 44. The pressure applied to the electronic parts 20 by the transfer head 44 is set to the lowest minimum pressure (0.01 to 1.0 MPa) that does not cause the damage in the electronic parts 20. Also, a heating temperature is set to 100 to 150° C., so that the first uncured resin layer 14 is fluidized to have an adhering function. As a result, as shown in FIG. 2D, the electronic parts 20 can be adhered temporarily onto the first uncured resin layer 14 without damage. In this case, the first uncured resin layer 14 still remains in its uncured condition at this stage.

Figure 2E:
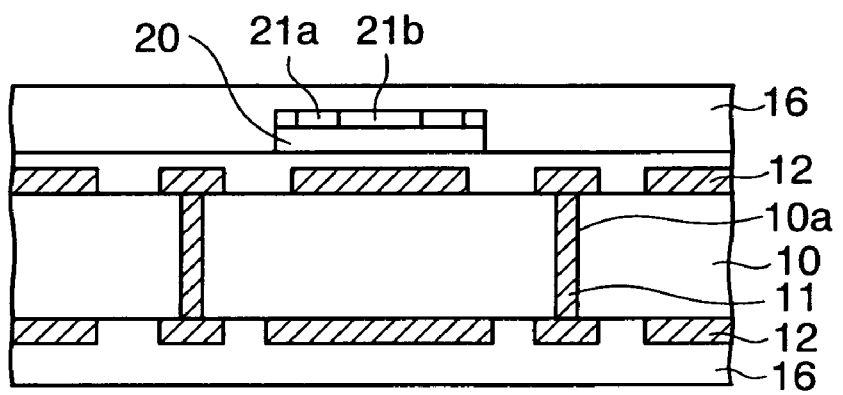

Then, as shown in FIG. 2E, a uncured resin film is arranged to cover the electronic parts 20, and then is pushed to the electronic parts side while heating the uncured resin film in the vacuum atmosphere. Thus, a second uncured resin layer 16 for covering the electronic parts 20 is formed. As an example of the processing conditions in this step, a pressure in the vacuum atmosphere: 133 Pa, a temperature: 120° C., a pushing force: 1 MPa, and a process time: 60 sec may be employed. As the material of the second uncured resin layer 16, the same resin material as the first uncured resin layer 14 may be employed. Also, in order to prevent generation of a bowing of the core substrate 10, the second uncured resin layer 16 is similarly formed on the lower surface side of the core substrate 10.

At this time, the second uncured resin layer 16 is formed to cover the electronic parts 20 in its fluidized state by the annealing. Therefore, there is no possibility that the electronic parts 20 is damaged upon pushing the second uncured resin layer 16 onto the electronic parts 20.

In addition, the second uncured resin layer 16 is formed in the vacuum atmosphere. Therefore, even though bubbles are interposed between the first uncured resin layer 14 and the electronic parts 20 adhered temporarily thereonto, the bubbles are removed and then the electronic parts 20 is adhered onto the first uncured resin layer 14 with good reliability. In other words, the electronic parts 20 is embedded between the first and second uncured resin layers 14, 16 not to generate the void.

Figure 2F:
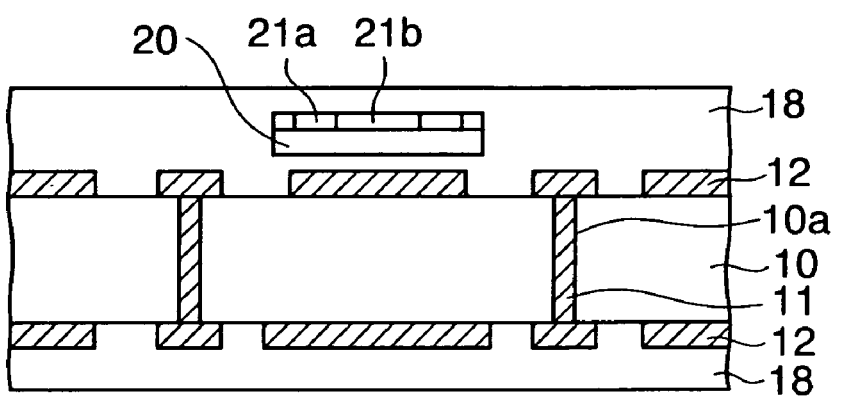

Then, as shown in FIG. 2F, when the annealing is applied to the first and second uncured resin layers 14, 16 at a temperature: 175° C. for a process time: 2 hour to cure completely, for example, a first interlayer insulating layer 18 is formed on both surface sides of the core substrate 10 respectively.

At this time, the first uncured resin layer 14 adhered temporarily onto the core substrate 10 is adhered completely to the core substrate 10, and also a structure in which the electronic parts 20 is embedded in the first interlayer insulating layer 18 can be obtained. In other words, the electronic parts 20 is brought into the condition that the electronic parts is embedded in the first interlayer insulating layer 18 made of the same material. Also, the first uncured resin layer 14 serves by stiffening as the adhesive layer to adhered the core substrate 10 and the electronic parts 20. Thus, there is no need to employ the die attaching material that is made the material different from the first interlayer insulating layer 18.

For this reason, the insulating layer made of the different material is not present around the electronic parts 20. Therefore, the thermal stress generated due to the difference of the coefficients of thermal expansion can be suppressed upon executing the reliability test by using the thermal cycle, and thus such faults can be overcome that the crack is caused in the first interlayer insulating layer 18, and the like.

Figure 2G:
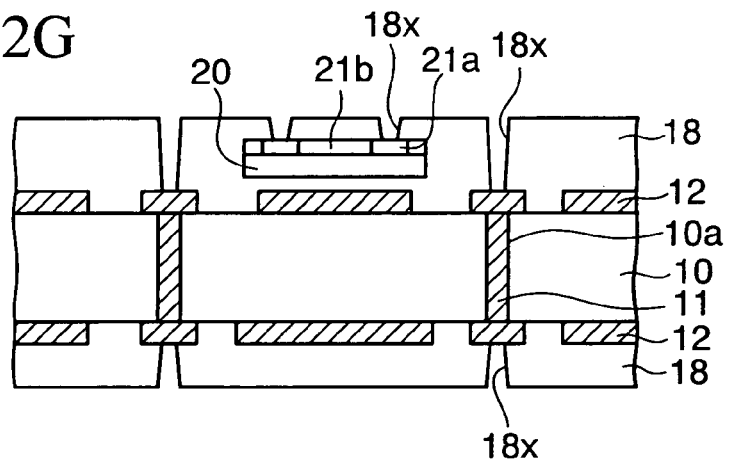

Then, as shown in FIG. 2G, the first interlayer insulating layer 18 formed on the upper surface side of the core substrate 10 is processed by the laser. Thus, a first via holes 18x each having a depth that reaches the connection pad 21a of the electronic parts 20 and the first wiring pattern 12 are formed respectively. Otherwise, the first via holes 18x may be formed by using the photolithography or the etching (RIE) in place of the laser. In addition, the first via holes 18x each having a depth that reaches the first wiring pattern 12 are formed in the first interlayer insulating layer 18 formed on the lower surface side of the core substrate 10.

Figure 2H:
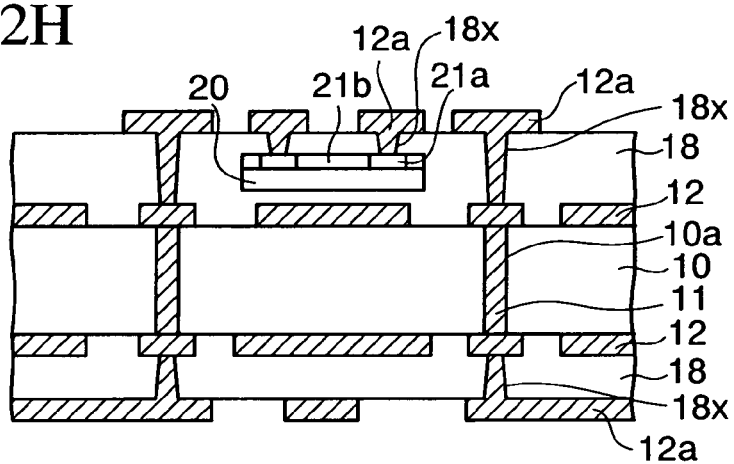

Then, as shown in FIG. 2H, second wiring patterns 12a each connected to the connection pad 21a of the electronic parts 20 and the first wiring pattern 12 via the first via hole 18x are formed on the upper surface side of the core substrate 10. Then, the second wiring patterns 12a each connected to the first wiring pattern 12 via the first via hole 18x are formed on the lower surface side of the core substrate 10.

The second wiring patterns 12a are formed by the semi-additive process, for example. In more detail, first a seed layer (not shown) is formed on the first interlayer insulating layer 18 and on inner surfaces of the first via holes 18x by the sputter method or the electroless plating. Then, a resist film (not shown) in which opening portions are provided to correspond to the second wiring patterns 12a is formed. Then, a metal film pattern (not shown) is formed in the opening portions of the resist film by the electroplating utilizing the seed layer as the plating power feeding layer. Then, the resist film is removed, and then the second wiring patterns 12a are formed by etching the seed layer while using the metal film pattern as a mask. In this case, the subtractive process or the full additive process may be employed in addition to the semi-additive process.

Figure 2I:
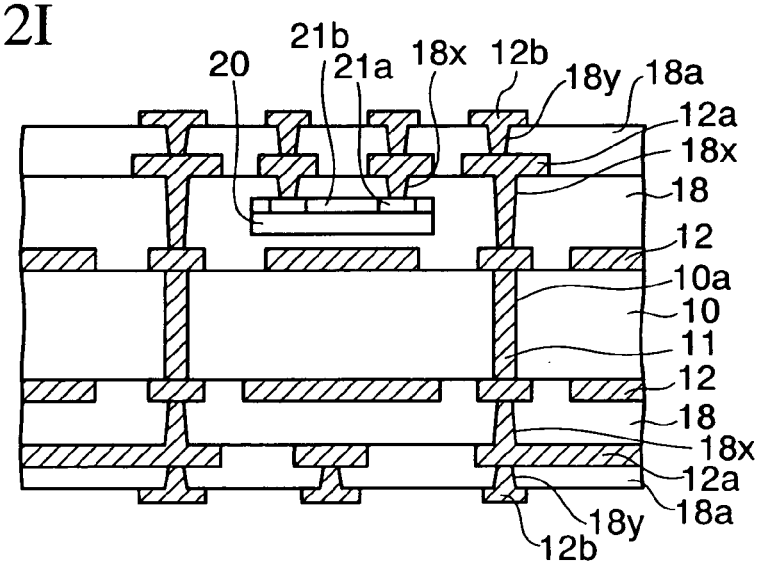

Then, as shown in FIG. 2I, third wiring patterns 12b are formed on both surface sides of the core substrate 10 by the same process as the above process respectively. Each of the third wiring patterns 12b is connected to the second wiring patterns 12a via a second via hole 18y formed in a second interlayer insulating layer 18a.

In the present embodiment, such a mode is illustrated that three-layered wiring patterns 12, 12a, 12b are formed on both surface sides of the core substrate 10 respectively. But such a mode may be employed that n-layered (n is an integer that is 1 or more) wiring patterns are stacked on both surface sides of the core substrate 10 respectively.

Figure 2J:
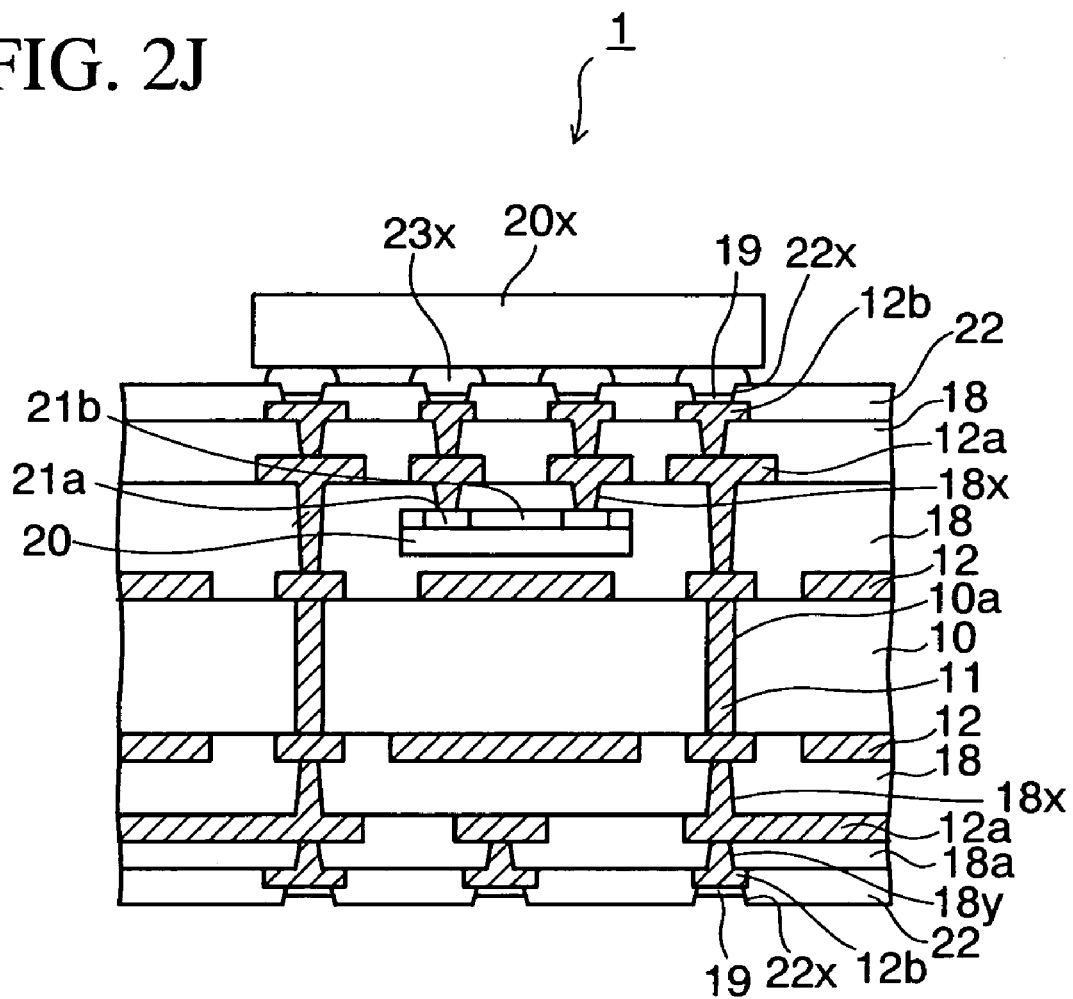

Then, as shown in FIG. 2J, a solder resist layer 22 in which opening portions 22x are provided on predetermined portions of the third wiring patterns 12b is formed on both surface sides of the core substrate 10 respectively. Then, the Ni/Au plating is applied onto the third wiring patterns 12b that are exposed from the opening portions 22x in the solder resist layer 22. Thus, a connection portion 19 is formed in the opening portions 22x on both surface sides of the core substrate 10 respectively.

Then, bumps 23x of an upper electronic parts 20x are flip-chip connected to the connection portions 19 in the third wiring patterns 12b on the upper surface side of the core substrate 10. As a result, an electronic parts packaging structure 1 in the first embodiment is obtained.

Then, the connection portions 19 formed in the third wiring patterns 12b on the lower surface side of the core substrate 10 serve as the external connection pads. When the package is of BGA (Ball Grid Array) type, external connection terminals (not shown) such as solder balls, gold bumps, or the like are provided to the connection portions 19 in the third wiring patterns 12b on the lower surface side of the core substrate 10, and then the external connection terminals are connected to the mother board (circuit board). Also, when the package is of LGA (Land Grid Array) type, the external connection terminals are omitted.

As explained above, according to the first embodiment, the first uncured resin layer 14 is formed on the core substrate 10 having the first wiring patterns 12 thereon, and then the electronic parts 20 is face-up adhered temporarily onto the first uncured resin layer 14. At this time, the electronic parts 20 is adhered temporarily onto the first uncured resin layer 14 by the low pushing force, and therefore there is no possibility that the electronic parts 20 is damaged.

Then, the uncured resin film is arranged on the electronic parts 20, and then is pushed to the electronic parts 20 side while heating in the vacuum atmosphere or the low-pressure atmosphere. Thus, the second uncured resin layer 16 for covering the electronic parts 20 is formed. At this time, since the second uncured resin layer 16 covers the electronic parts 20 in its fluidized state by the annealing, such a fault can be overcome that the crack is caused in the electronic parts 20, and the like.

In addition, since the same insulating material can be chosen as the first and second uncured resin layers 14, 16, the electronic parts 20 is embedded in the first interlayer insulating layer 18 made of the same material. Therefore, the thermal stress generated due to the difference of the coefficients of thermal expansion can be suppressed in applying the reliability test to the electronic parts packaging structure by using the thermal cycle. As a result, such faults can be overcome that the crack is caused in the first interlayer insulating layer 18, the defective contact is generated between the connection pads 21a of the electronic parts 20 and the second wiring patterns 12a, and the like, and thus the reliability of the electronic parts packaging structure can be improved.

In other words, upon actually using the electronic parts packaging structure 1 in the first embodiment, the crack due to the thermal stress and generation of the defective contact can be prevented.

Second Embodiment

FIGS. 3A to 3E are sectional views showing a method of manufacturing an electronic parts packaging structure according to a second embodiment of the present invention. A difference of the second embodiment from the first embodiment resides in that the electronic parts having the bumps is face-down mounted in the first embodiment.

In the second embodiment, detailed explanation of the same steps as those in the first embodiment will be omitted.

Figure 3A:
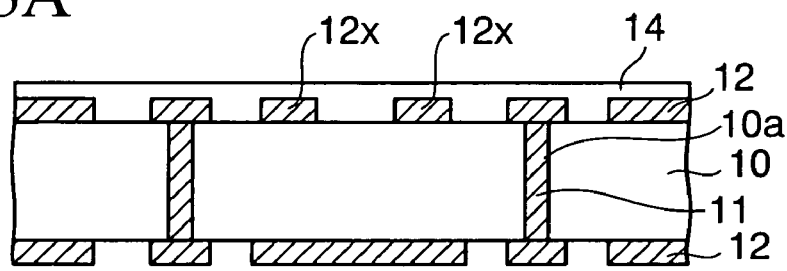
FIGS. 3A to 3E are sectional views showing a method of manufacturing an electronic parts packaging structure according to a second embodiment of the present invention.

In the method of manufacturing the electronic parts packaging structure in the second embodiment, as shown in FIG. 3A, first the core substrate 10 having the first wiring patterns 12 on both surfaces is prepared, like the first embodiment. In this event, in the core substrate 10 in the second embodiment, the connection pads 12x corresponding to the bumps of the electronic parts are provided in the first wiring patterns 12 provided on the upper side. Then, the first uncured resin layer 14 is temporarily adhered onto the upper surface of the core substrate 10 by the same process as in the first embodiment.

Figure 3B:
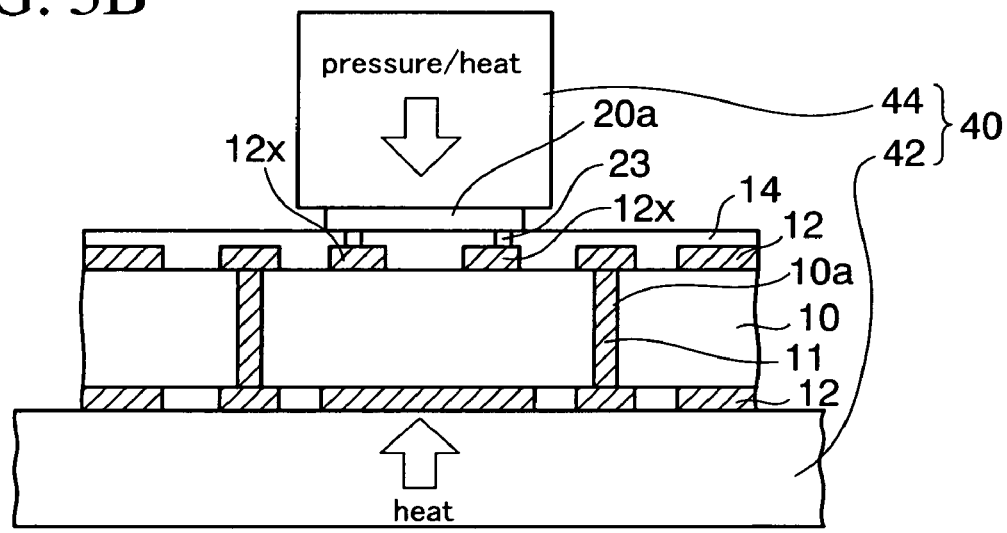

Then, as shown in FIG. 3B, an electronic parts 20a having bumps 23 made of copper or gold thereon is prepared. Then, the core substrate 10 is loaded onto the stage 42 of the electronic parts mounting device 40, then the electronic parts 20a is picked up by the transfer head 44 such that the bumps 23 of the electronic parts 20a are directed downward (face-down), and then the electronic parts 20a is arranged on the first uncured resin layer 14 such that the bumps 23 of the electronic parts 20a are aligned with the connection pads 12x of the first wiring patterns 12. Then, the bumps 23 of the electronic parts 20a are embedded in the first uncured resin layer 14 by pushing the transfer head 44 downward. Thus, the bumps 23 of the electronic parts 20a are connected electrically to the connection pads 12x of the first wiring patterns 12. A height of the bump 23 of the electronic parts 20a is set to almost 20 μm, for example, and a film thickness of the first uncured resin layer 14 is set to correspond to the height of the bump 23.

At this time, like the first embodiment, since the first uncured resin layer 14 is heated at 100 to 150° C. and fluidized, the bumps 23 of the electronic parts 20a can be embedded into the first uncured resin layer 14 by a small pushing force. Therefore, there is no possibility that the electronic parts 20a is damaged. In this manner, only the bumps 23 of the electronic parts 20a can be embedded selectively into the first uncured resin layer 14.

Figure 3C:
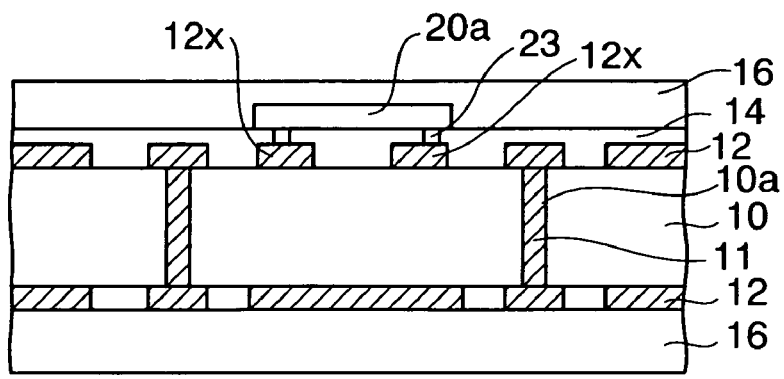

Then, as shown in FIG. 3C, the second uncured resin layer 16 for covering the electronic parts 20a is formed by the same method as in the first embodiment. The second uncured resin layer 16 is also formed on the lower surface side of the core substrate 10. As explained in the first embodiment, the second uncured resin layer 16 is formed in the vacuum atmosphere in its fluidized state by the heating, there is no possibility that the damage is caused in the electronic parts 20a.

Figure 3D:
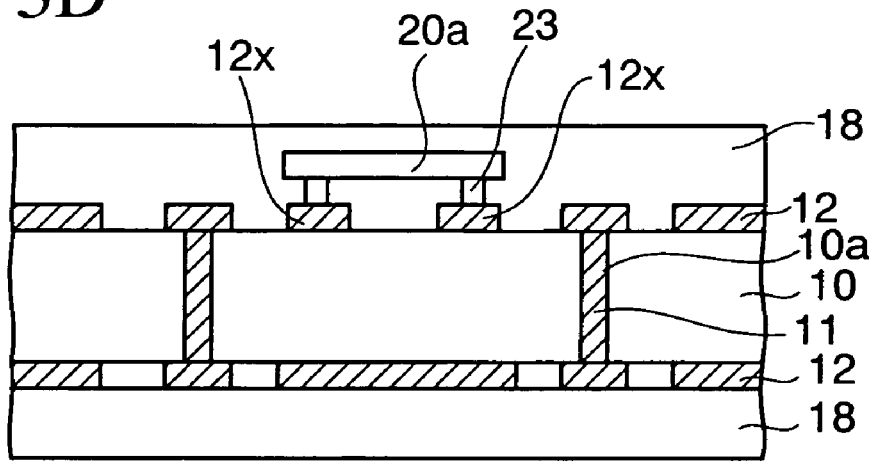

Then, as shown in FIG. 3D, like the first embodiment, the first and second uncured resin layers 14, 16 are cured completely by the annealing. Thus, the first interlayer insulating layer 18 is obtained on both surface sides of the core substrate 10 respectively. Therefore, such a structure can be obtained that the electronic parts 20a is embedded in the first interlayer insulating layer 18 and also the bumps 23 of the electronic parts 20a are flip-chip connected to the connection pads 12x of the first wiring patterns 12. Like the first embodiment, the electronic parts 20a is surrounded with the first interlayer insulating layer 18 made of the same material and embedded therein. Therefore, the insulating layer made of the different material is not present around the electronic parts 20a. As a result, like the first embodiment, such faults can be overcome that the crack is caused in the first interlayer insulating layer 18, the defective contact is generated between the bumps 23 of the electronic parts 20a and the first wiring patterns 12, and the like, and thus the reliability of the electronic parts packaging structure can be improved.

Figure 3E:
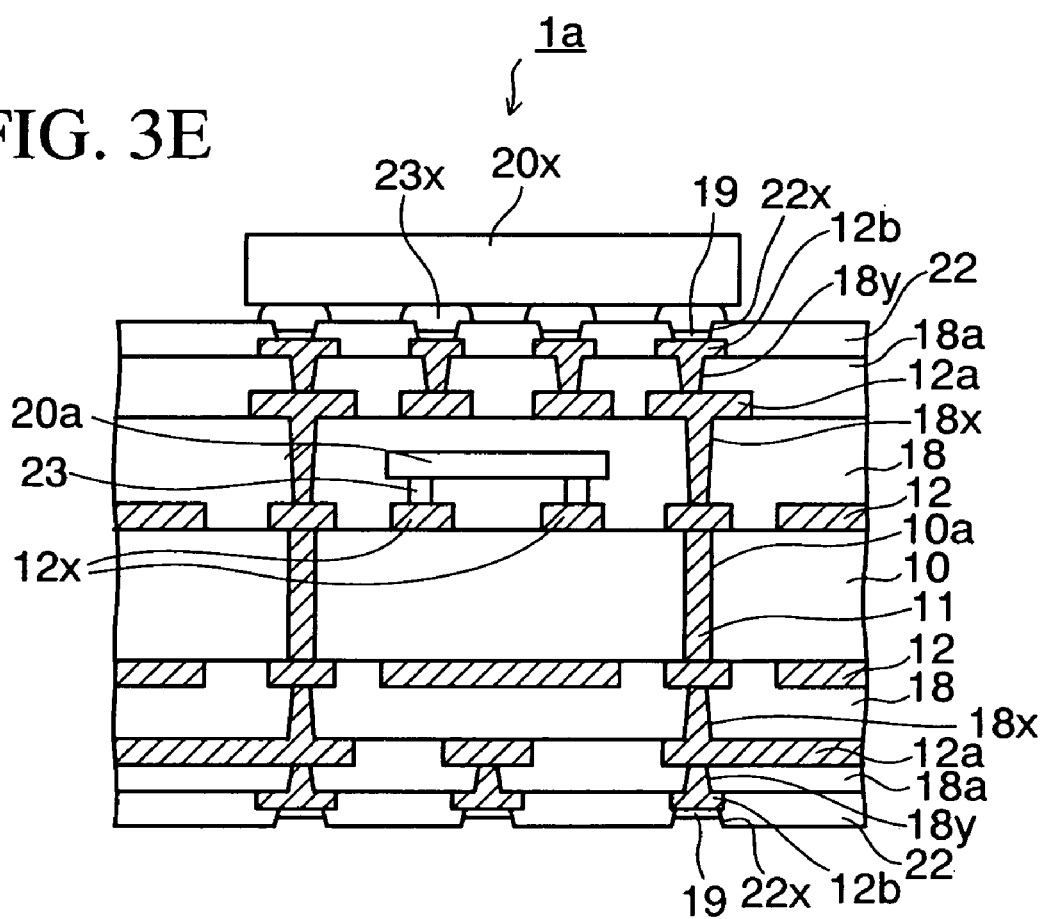

Then, as shown in FIG. 3E, the built-up wirings (second and third wiring patterns 12a, 12b) similar to the first embodiment are formed, and the bumps 23x of the upper electronic parts 20x are connected to the connection portions 19 of the uppermost third wiring patterns 12b. As a result, an electronic parts packaging structure 1a in the second embodiment can be obtained.

In the second embodiment, since the bumps 23 of the electronic parts 20a are flip-chip connected to the connection pads 12x of the wiring patterns 12, there is no need to form the via holes in the interlayer insulating layer 18 on the electronic parts 20a. Since other steps are identical to those in the first embodiment, their explanation will be omitted herein.

According to the second embodiment, the similar advantages as those in the first embodiment can be achieved.

Third Embodiment

FIGS. 4A to 4K are sectional views showing a method of manufacturing an electronic parts packaging structure according to a third embodiment of the present invention. Such a mode is given by the third embodiment that the structure in which the electronic parts is embedded in the interlayer insulating layer is formed on the temporal substrate by the same method as the first embodiment, and then the interlayer insulating layer is used as the core substrate by removing the temporal substrate. In the third embodiment, detailed explanation of the same steps as those in the first embodiment will be omitted.

Figure 4A:
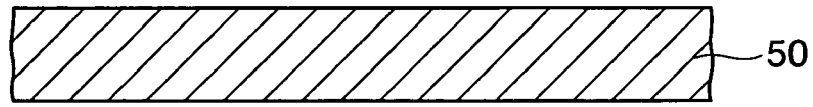
FIGS. 4A to 4K are sectional views showing a method of manufacturing an electronic parts packaging structure according to a third embodiment of the present invention.

In the method of manufacturing the electronic parts packaging structure in the third embodiment, as shown in FIG. 4A, first a first temporal substrate 50 made of copper (Cu), nickel (Ni), stainless steel (SUS), or the like is prepared. As the first temporal substrate 50, a flexible substrate such as a metallic foil, or the like may be employed. But preferably the rigid substrate should be employed.

Figure 4B:
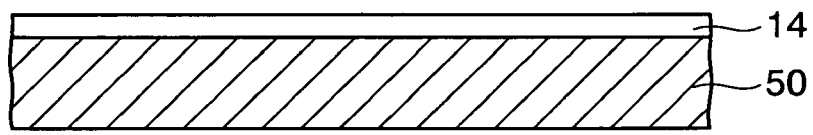
Figure 4C:
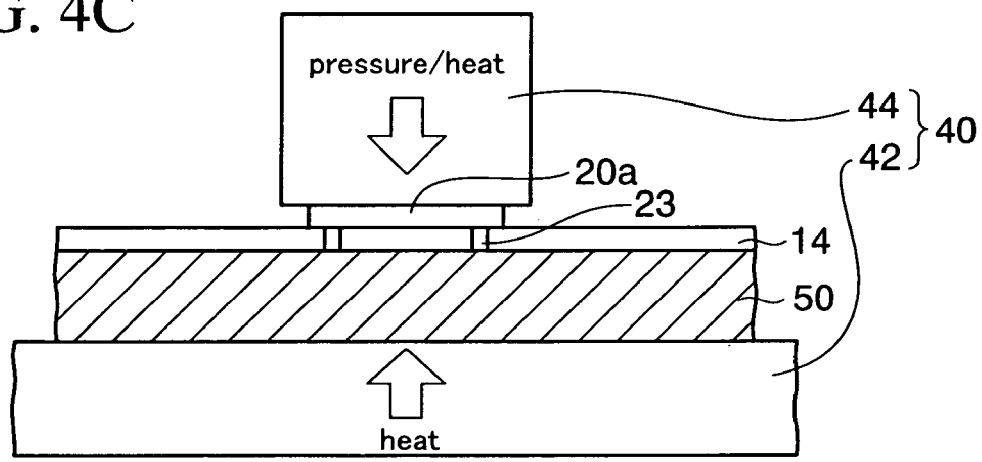

Then, as shown in FIG. 4B, the first uncured resin layer 14 is temporarily adhered onto the first temporal substrate 50 by the same method as the first embodiment. Then, as shown in FIG. 4C, according to the same method as the second embodiment, the first temporal substrate 50 is placed on the stage 42 of the electronic parts mounting device 40, then the electronic parts 20a is picked up by the transfer head 44 such that the bumps 23 of the electronic parts 20a are directed downward (face-down), and then the bumps 23 of the electronic parts 20a are embedded selectively in the first uncured resin layer 14 to come in touch with the first temporal substrate 50.

Figure 4D:
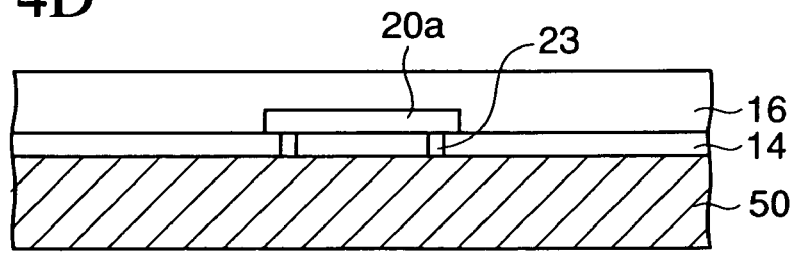
Figure 4E:
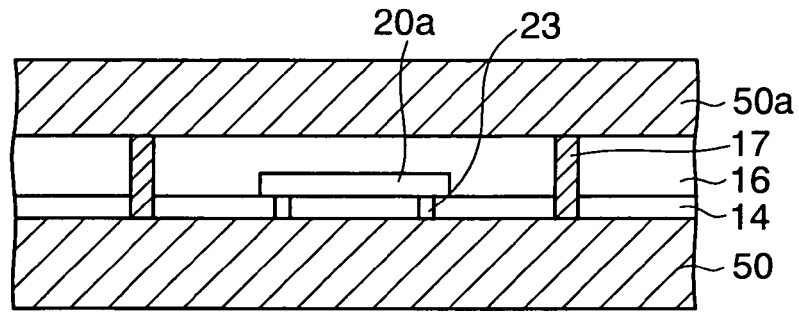

Then, as shown in FIG. 4D, the second uncured resin layer 16 for covering the electronic parts 20a is formed by the same method as the first embodiment. Then, as shown in FIG. 4E, such a structure is formed that conductive posts 17 are provided to pass through the first and second uncured resin layers 14, 16 and a second temporal substrate 50a is arranged on the second uncured resin layer 16. As the second temporal substrate 50a, the same material as the first temporal substrate 50 may be used.

As a first method of forming such structure, the second temporal substrate 50a on which the conductive posts 17 made of Cu, Au, or the like are provided upright is prepared. The conductive posts 17 are formed by applying the stamping or the etching process to the metal plate serving as the second temporal substrate 50a.

Then, the conductive posts 17 provided upright on the second temporal substrate 50a are thrust into the first and second uncured resin layers 14, 16. Thus, the conductive posts 17 that pass through the first and second uncured resin layers 14, 16 are formed, and also the second temporal substrate 50a is arranged on the second uncured resin layer 16.

Also, as a second method, the via holes each reaching the first temporal substrate 50 are formed in the first and second uncured resin layers 14, 16 by the laser or the RIE, then the conductive posts 17 are formed by filling the conductive paste (conductor) made of Cu or Ag in the via holes, and then the second temporal substrate 50a is arranged on the second uncured resin layer 16. In this event, upon employing the second method, the conductor (copper, or the like) may be formed in the via holes as the conductive posts 17 by the electroplating utilizing the first temporal substrate 50 as the plating power feeding layer, instead of filling the conductive paste after the via holes are formed.

Figure 4F:
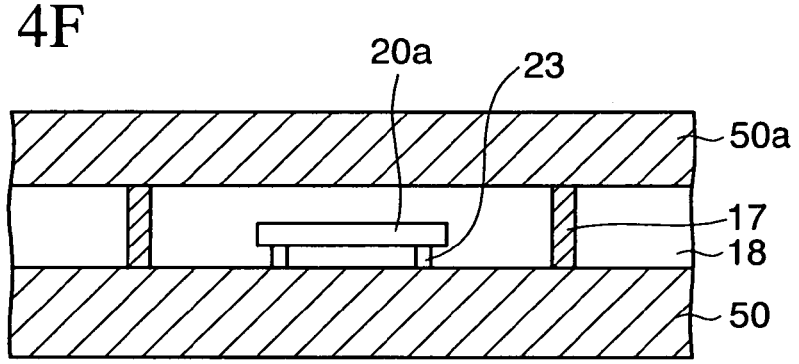
Figure 4G:
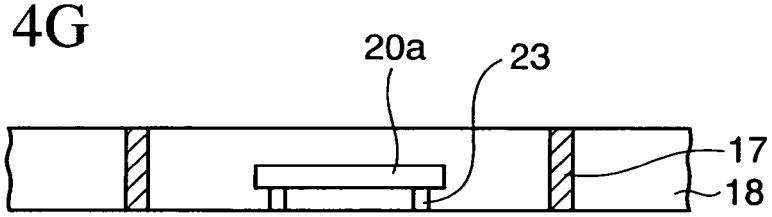

Then, as shown in FIG. 4F, the first and second uncured resin layers 14, 16 are cured completely by the annealing, and thus the first interlayer insulating layer 18 is obtained. Then, as shown in FIG. 4G, the first and second temporal substrates 50, 50a are removed selectively to leave the first interlayer insulating layer 18, the conductive posts 17, and the bumps 23 of the electronic parts 20a. In case the first and second temporal substrates 50, 50a are made of Cu or Ni, the wet etching using an iron (III) chloride aqueous solution, a copper (II) chloride aqueous solution, or an ammonium peroxodisulfate aqueous solution is employed. Also, in case the first and second temporal substrates 50, 50a are made of an iron-based alloy such as a stainless steel, or the like, the first and second temporal substrates 50, 50a may be removed selectively by the polishing process using the chemical polishing agent that contains hydrogen peroxide and ammonium hydrogendifluoride as major components.

In this case, it is preferable that the material that can be removed selectively with respect to the conductive posts 17 and the bumps 23 of the electronic parts 20a should be chosen as the first and second temporal substrates 50, 50a.

Accordingly, both surfaces of the first interlayer insulating layer 18 are exposed, and also top end portions and bottom end portions of the conductive posts 17 and top end portions of the bumps 23 of the electronic parts 20a are exposed. In the third embodiment, the first and second temporal substrates 50, 50a are removed and thus the first interlayer insulating layer 18 acts as the core substrate.

Figure 4H:
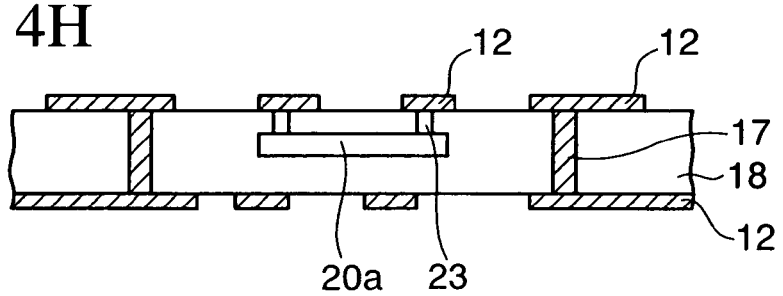

Then, as shown in FIG. 4H, the resultant structure in FIG. 4G is turned upside down, and then the first wiring patterns 12 each connected to the bump 23 of the electronic parts 20a and the top end portion of the conductive post 17 are formed on the upper surface of the first interlayer insulating layer, 18. Then, the first wiring patterns 12 connected to the bottom end portions of the conductive posts 17 are formed on the lower surface of the first interlayer insulating layer 18.

Figure 4I:
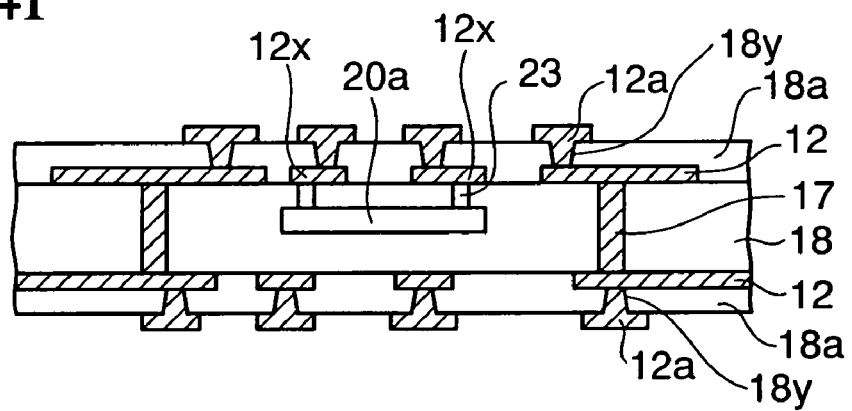
Figure 4J:
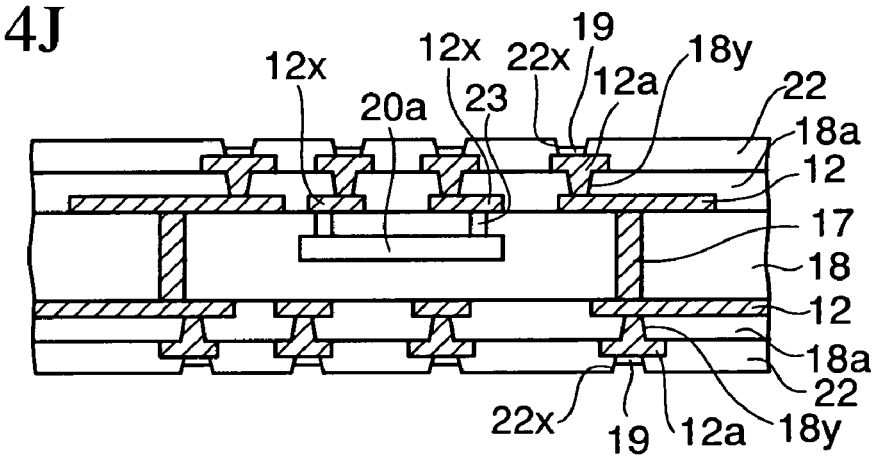

Then, as shown in FIG. 4I, like the first embodiment, the second wiring patterns 12a are formed on the second interlayer insulating layer 18a on both surface sides of the first interlayer insulating layer 18 respectively. Each of the second wiring patterns 12a is connected to the first wiring pattern 12 via the second via hole 18y provided in the second interlayer insulating layer 18a. Then, as shown in FIG. 4J, the solder resist film 22 in which the opening portions 22x are provided on the second wiring patterns 12a is formed on both surface sides of the second interlayer insulating layer 18a. Then, the connection portions 19 are formed by applying the Ni/Au plating to the second wiring patterns 12a in the opening portions 22x. In this case, the wiring patterns connected electrically to the bumps 23 of the electronic parts 20a may be formed as the n-layered (n is an integer that is 1 or more) wirings.

Figure 4K:
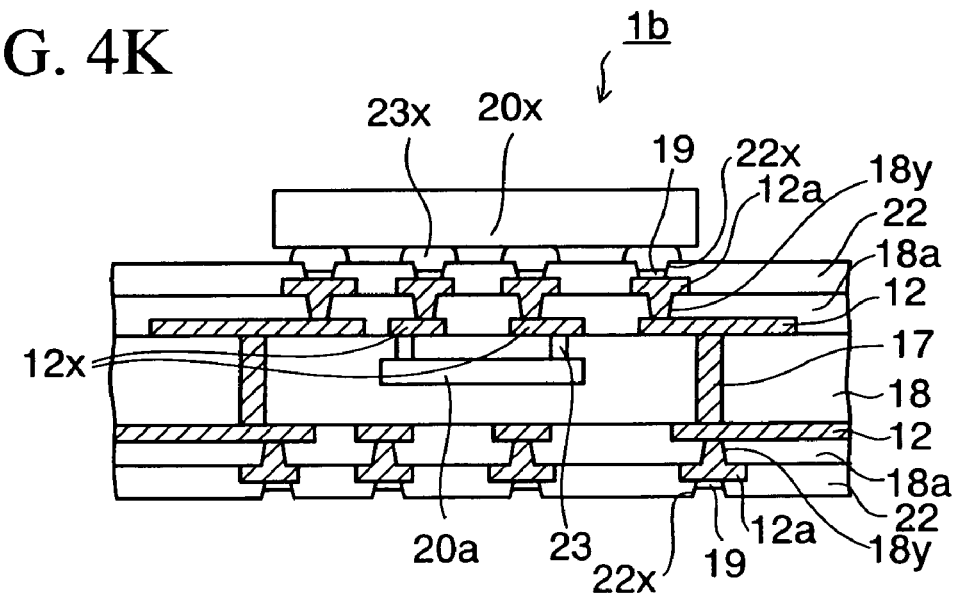

Then, as shown in FIG. 4K, the bumps 23x of the upper electronic parts 20x are flip-chip connected to the connection portions 19 of the second wiring patterns 12a over the second interlayer insulating layer 18a.

With the above, an electronic parts packaging structure 1b in the third embodiment can be completed.

According to the third embodiment, the similar advantages to those in the first and second embodiments can be achieved and also an overall thickness of the electronic parts packaging structure can be reduced rather than the first and second embodiments since the first interlayer insulating layer 18 in which the electronic parts 20a is embedded can serve as the core substrate.

Fourth Embodiment

FIGS. 5A to 5J are sectional views showing a method of manufacturing an electronic parts packaging structure according to a fourth embodiment of the present invention. Such a mode is given by the fourth embodiment that the electronic parts having no bump in the third embodiment is face-up packaged. In the fourth embodiment, detailed explanation of the same steps as those in the first to third embodiments will be omitted herein.

Figure 5A:
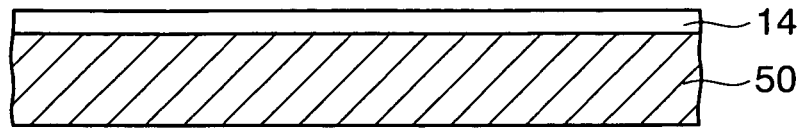
FIGS. 5A to 5J are sectional views showing a method of manufacturing an electronic parts packaging structure according to a fourth embodiment of the present invention.
Figure 5B:
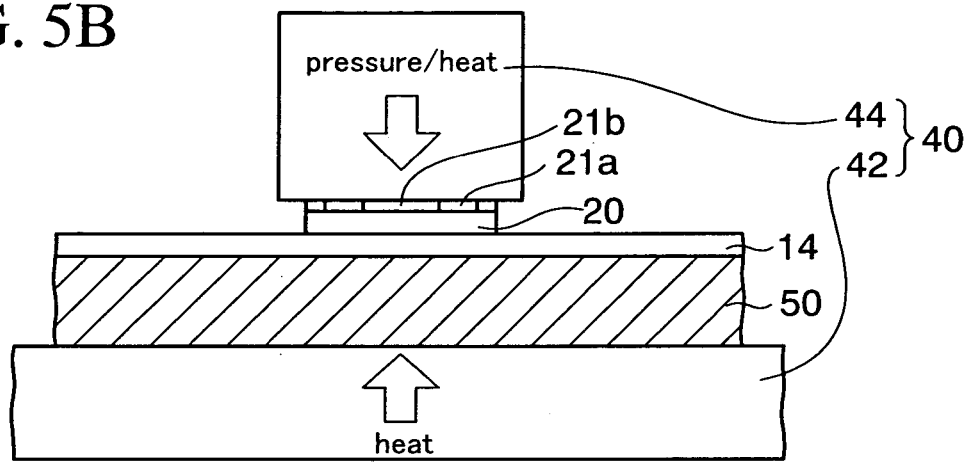

In the method of manufacturing the electronic parts packaging structure in the fourth embodiment, as shown in FIG. 5A, first the first uncured resin layer 14 is temporarily adhered onto the first temporal substrate 50, like the third embodiment. Then, as shown in FIG. 5B, according to the same method as the first embodiment, the first temporal substrate 50 is placed on the stage 42 of the electronic parts mounting device 40, then the electronic parts 20 is picked up by the transfer head 44 such that the connection pads 21a of the electronic parts 20 are directed upward (face-up), and then the electronic parts 20 is temporarily adhered onto the first uncured resin layer 14.

Figure 5C:
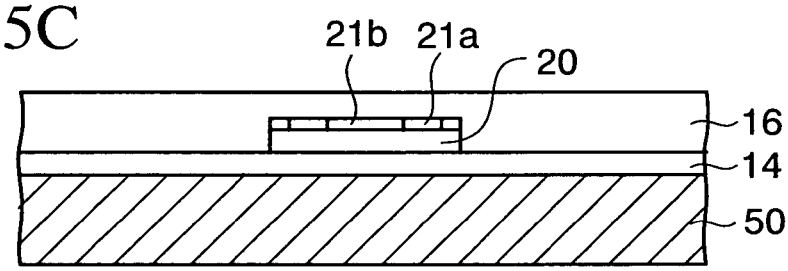
Figure 5D:
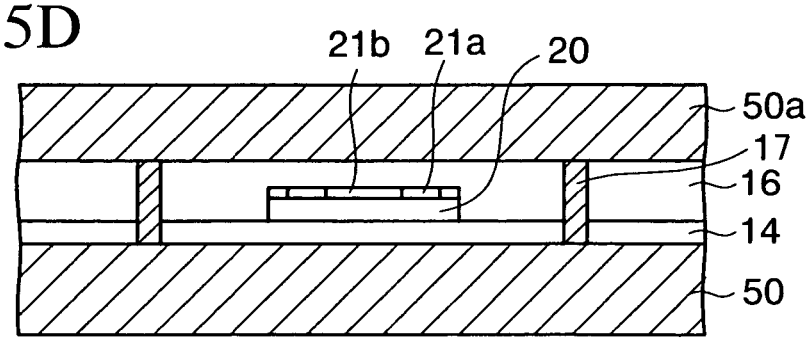
Figure 5E:
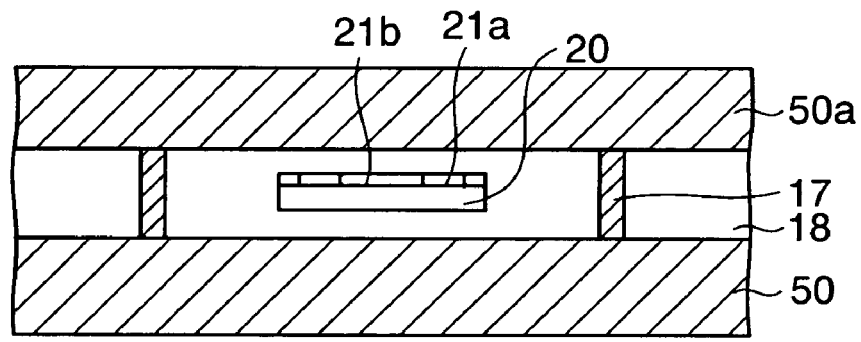

Then, as shown in FIG. 5C, the second uncured resin layer 16 for covering the electronic parts 20 is formed by the same method as the first embodiment. Then, as shown in FIG. 5D, like FIG. 4E in the third embodiment, such a structure is formed that the conductive posts 17 that pass through the first and second uncured resin layers 14, 16 are provided and also the second temporal substrate 50a is arranged on the second uncured resin layer 16. Then, as shown in FIG. 5E, the first and second uncured resin layers 14, 16 are cured completely by the annealing and thus the first interlayer insulating layer 18 in which the electronic parts 20 is embedded is obtained.

Figure 5F:
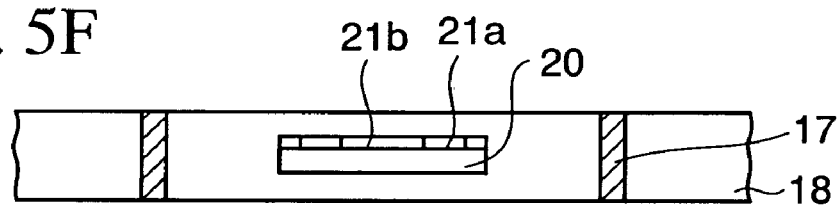

Then, as shown in FIG. 5F, like the third embodiment, the first and second temporal substrates 50, 50a are removed selectively with respect to the first interlayer insulating layer 18 and the conductive posts 17.

Figure 5G:
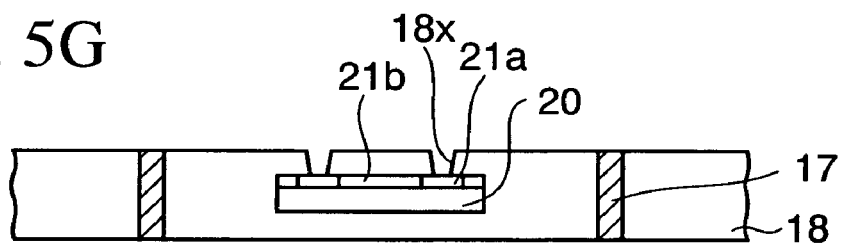
Figure 5H:
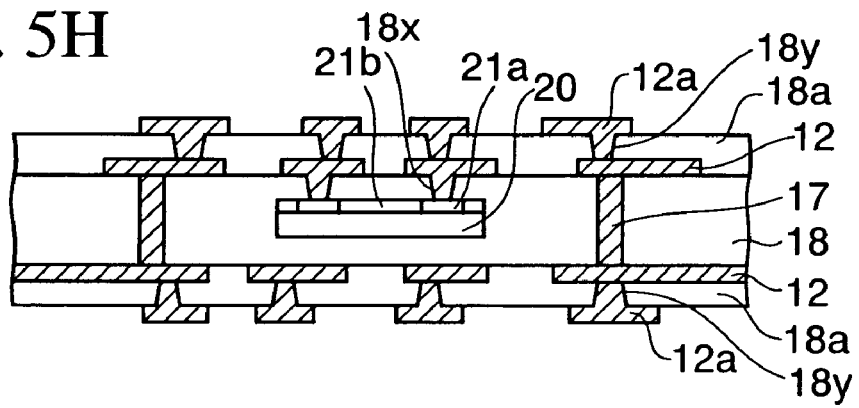

Then, as shown in FIG. 5G, the first via holes 18x are formed in portions, which are located on the connection pads 21a of the electronic parts 20, of the first interlayer insulating layer 18. Then, as shown in FIG. 5H, the first wiring patterns 12 each connected to the connection pad 21a of the electronic parts 20 via the first via hole 18x and the top end portion of the conductive post 17 are formed on the upper surface of the first interlayer insulating layer 18. Also, the first wiring patterns 12 connected to the bottom end portions of the conductive posts 17 are formed on the lower surface of the first interlayer insulating layer 18.

Figure 5I:
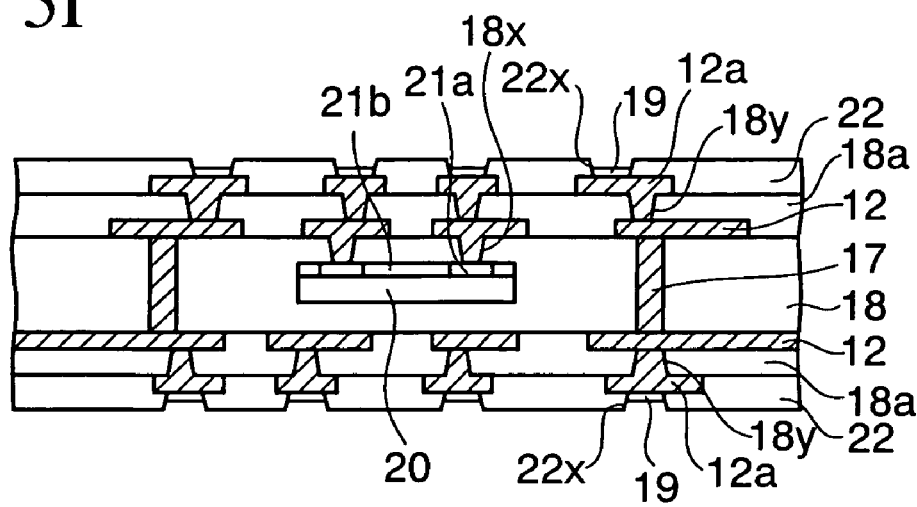

In addition, the second wiring patterns 12a connected to the first wiring patterns 12 via the second via holes 18y provided in the second interlayer insulating layer 18a are formed on both surface sides of the first interlayer insulating layer 18 respectively. Then, as shown in FIG. 5I, the solder resist film 22 in which the opening portions 22x are provided on the second wiring patterns 12a is formed on both surface sides of the second interlayer insulating layer 18a respectively, and then the connection portions 19 are formed by applying the Ni/Au plating onto the second wiring patterns 12a in the opening portions 22x.

In this case, the wiring patterns connected electrically to the connection pads 21a of the electronic parts 20 may be formed as the n-layered (n is an integer that is 1 or more) wirings.

Figure 5J:
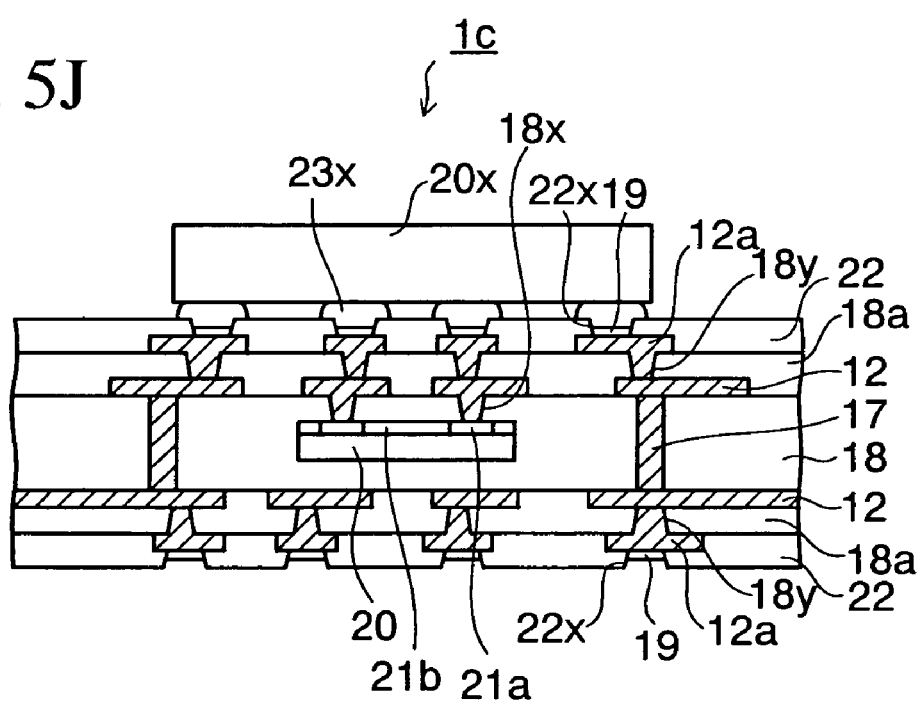

Then, as shown in FIG. 5J, the bumps 23x of the upper electronic parts 20x are flip-chip connected to the connection portions 19 of the second wiring patterns 12a over the first interlayer insulating layer 18.

With the above, an electronic parts packaging structure 1c in the fourth embodiment can be completed.

According to the fourth embodiment, the similar advantages to those in the first and second embodiments can be achieved and also the electronic parts packaging structure can be thinned like the third embodiment.

What is claimed is:

1. A method of manufacturing an electronic parts packaging structure, comprising the steps of:
    forming a first uncured resin layer on a substrate;
    arranging an electronic parts on the first uncured resin layer;
    forming a second uncured resin layer that covers the electronic parts; and
    obtaining an insulating layer, in which the electronic parts is embedded, by curing the first uncured resin layer and the second uncured resin layer by annealing.

2. A method of manufacturing an electronic parts packaging structure, according to claim 1, wherein the substrate is a first temporal substrate, and
    after the step of forming the second uncured resin layer but before the step of obtaining the insulating layer, further comprising the step of:
    forming a structure in which a conductive post that passes through the first uncured resin layer and the second uncured resin layer is provided and a second temporal substrate is arranged on the second uncured resin layer; and
    after the step of obtaining the insulating layer, further comprising the step of:
    removing selectively the first temporal substrate and the second temporal substrate.

3. A method of manufacturing an electronic parts packaging structure, according to claim 1, wherein the first uncured resin layer and the second uncured resin layer are made of a same material.

4. A method of manufacturing an electronic parts packaging structure, according to claim 1, wherein, in the step of arranging the electronic parts, the electronic parts has a connection pad and the electronic parts is arranged to direct the connection pad upward.

5. A method of manufacturing an electronic parts packaging structure, according to claim 1, wherein, in the step of arranging the electronic parts, the electronic parts has a bump and the bump of the electronic parts is embedded selectively in the first uncured resin layer.

6. A method of manufacturing an electronic parts packaging structure, according to claim 1, wherein the substrate has a wiring pattern and the electronic parts has a connection pad,
    in the step of arranging the electronic parts, the electronic parts is arranged to direct the connection pad upward, and
    after the step of obtaining the insulating layer in which the electronic parts is embedded, further comprising the step of:
    forming n-layered (n is an integer that is 1 or more) wiring patterns that are connected electrically to a connection pad of the electronic parts and a wiring pattern on the substrate via via holes provided in the insulating layer.

7. A method of manufacturing an electronic parts packaging structure, according to claim 1, wherein the substrate has a wiring pattern and the electronic parts has a bump,
    in the step of arranging the electronic parts, the bump of the electronic parts is connected electrically to a wiring pattern on the substrate by embedding selectively the bump of the electronic parts in the first uncured resin layer, and
    after the step of obtaining the insulating layer in which the electronic parts is embedded, further comprising the step of:
    forming n-layered (n is an integer that is 1 or more) wiring patterns that are connected electrically to a connection pad of the electronic parts and a wiring pattern on the substrate via via holes provided in the insulating layer.

8. A method of manufacturing an electronic parts packaging structure, according to claim 6, wherein the wiring pattern on the substrate is formed on both surfaces of the substrate in a state that the wiring patterns are connected mutually via a conductive post provided to pass through the substrate, and the n-layered wiring patterns are formed on both surface sides of the substrate.

9. A method of manufacturing an electronic parts packaging structure, according to claim 2, wherein the step of forming the structure in which the conductive post is provided and the second temporal substrate is arranged includes the steps of, forming a via hole that passes through the first uncured resin layer and the second uncured resin layer, obtaining the conductive post by filling a conductor in the via hole, and arranging the second temporal substrate on the second uncured resin layer.

10. A method of manufacturing an electronic parts packaging structure, according to claim 2, wherein the step of forming the structure in which the conductive post is provided and the second temporal substrate is arranged includes the step of, thrusting the conductive post provided upright on the second temporal substrate into the first uncured resin layer and the second uncured resin layer.

11. A method of manufacturing an electronic parts packaging structure, according to claim 2, wherein, in the step of arranging the electronic parts, the electronic parts has a bump and the bump of the electronic parts is embedded in the first uncured resin layer, and after the step of removing selectively the first temporal substrate and the second temporal substrate, further comprising the step of:

forming n-layered (n is an integer that is 1 or more) wiring patterns that are connected electrically to the bump of the electronic parts and the conductive post.

12. A method of manufacturing an electronic parts packaging structure, according to claim 2, wherein, in the step of arranging the electronic parts, the electronic parts has a connection pad and the electronic parts is arranged to direct the connection pad upward, and after the step of removing selectively the first temporal substrate and the second temporal substrate, further comprising the step of:

forming n-layered (n is an integer that is 1 or more) wiring patterns that are connected electrically to the connection pad of the electronic parts via the via hole provided in the insulating layer and are connected electrically to the conductive post.

13. A method of manufacturing an electronic parts packaging structure, according to claim 11, wherein the n-layered wiring patterns are formed on both surface sides of the insulating film in a state that the n-layered wiring patterns are electrically connected mutually via the conductive post provided in the insulating layer.

14. A method of manufacturing an electronic parts packaging structure, according to claim 6, further comprising the step of:

flip-chip connecting an upper electronic parts to an uppermost wiring pattern of the n-layered wiring patterns.

15. A method of manufacturing an electronic parts packaging structure, according to claim 1, wherein the step of arranging the electronic parts is the step of adhering temporarily the electronic parts onto the first uncured resin layer by pushing the electronic parts with a pressure of 0.01 to 1.0 MPa while heating the first uncured resin layer.

16. A method of manufacturing an electronic parts packaging structure, according to claim 1, wherein the step of forming the second uncured resin layer includes the step of pressing an uncured resin film toward the electronic parts side in a state that the resin film is fluidized by heating in a vacuum atmosphere.

17. A method of manufacturing an electronic parts packaging structure, according to claim 1, wherein the first uncured resin layer and the second uncured resin layer are made of any one of an epoxy resin, a polyimide resin, and a polyphenylene ether resin.

18. A method of manufacturing an electronic parts packaging structure, according to claim 1, wherein the electronic parts is a semiconductor chip or a passive component.

19. A method of manufacturing an electronic parts packaging structure, according to claim 2, wherein the first temporal substrate and the second temporal substrate are made of a copper, a nickel, or a stainless steel.

* * * * *